(12) United States Patent
Mackie et al.

(10) Patent No.: US 9,240,301 B1
(45) Date of Patent: Jan. 19, 2016

(54) THERMAL-FIELD TYPE ELECTRON SOURCE COMPOSED OF TRANSITION METAL CARBIDE MATERIAL WITH ARTIFICIAL FACET

(71) Applicant: Applied Physics Technologies, Inc., McMinnville, OR (US)

(72) Inventors: William A. Mackie, McMinnville, OR (US); Gerald G. Magera, Hillsboro, OR (US)

(73) Assignee: Applied Physics Technologies, Inc., McMinnville, OR (US)

( * ) Notice: Subject to any disclaimer, the term of this patent is extended or adjusted under 35 U.S.C. 154(b) by 2 days.

(21) Appl. No.: 13/851,732

(22) Filed: Mar. 27, 2013

Related U.S. Application Data

(60) Provisional application No. 61/616,333, filed on Mar. 27, 2012.

(51) Int. Cl.
    *H01J 1/14* (2006.01)
    *H01J 1/146* (2006.01)
    *H01J 19/10* (2006.01)
    *H01J 1/148* (2006.01)

(52) U.S. Cl.
    CPC . *H01J 19/10* (2013.01); *H01J 1/14* (2013.01); *H01J 1/146* (2013.01); *H01J 1/148* (2013.01); *H01J 2201/196* (2013.01); *H01J 2201/2889* (2013.01); *H01J 2201/30484* (2013.01); *H01J 2201/317* (2013.01)

(58) Field of Classification Search
    CPC ............... H01J 1/13; H01J 1/14; H01J 1/146; H01J 1/148; H01J 1/16; H01J 2201/196; H01J 2201/2889; H01J 2201/30484; H01J 2201/317
    USPC .................................................. 313/309–311
    See application file for complete search history.

(56) References Cited

U.S. PATENT DOCUMENTS

| | | | | |
|---|---|---|---|---|
| 4,193,013 A | * | 3/1980 | Futamoto et al. | 313/336 |
| 4,430,570 A | * | 2/1984 | Takigawa et al. | 313/336 |
| 4,486,684 A | * | 12/1984 | Hohn | 313/336 |
| 6,682,383 B2 | * | 1/2004 | Cho et al. | 445/50 |
| 2004/0119023 A1 | * | 6/2004 | Nakasuji et al. | 250/396 R |
| 2010/0194262 A1 | * | 8/2010 | Nonogaki et al. | 313/343 |

FOREIGN PATENT DOCUMENTS

JP    56018336 A   *   2/1981

* cited by examiner

*Primary Examiner* — Mariceli Santiago
(74) *Attorney, Agent, or Firm* — Stoel Rives LLP

(57) ABSTRACT

An electron source is made from mixed-metal carbide materials of high refractory nature. Producing field-enhanced thermionic emission, i.e., thermal-field or extended Schottky emission, from these materials entails the use of a certain low work function crystallographic direction, such as, for example, (100), (210), and (310). These materials do not naturally facet because of their refractory nature. The disclosed electron source made from transition metal carbide material is especially useful when installed in a scanning electron microscope (SEM) performing advanced imaging applications that require a high brightness, high beam current source.

12 Claims, 7 Drawing Sheets

| Emitter | Truncation (D)/radius (R) | Spot size |
|---|---|---|
| Zr/O/W(100) | D = ~300 nm | 26.4 nm |
| HfC(310) – tip #137 | D = ~200 nm | 19.0 nm |
| HfC(310) – tip #130 | D = ~125 nm | 13.2 nm |
| HfC(310) – tip #132 | R = ~150 nm | 9.9 nm |

…

THERMAL-FIELD TYPE ELECTRON SOURCE COMPOSED OF TRANSITION METAL CARBIDE MATERIAL WITH ARTIFICIAL FACET

RELATED APPLICATION

This application claims benefit of U.S. Provisional Patent Application No. 61/616,333, filed Mar. 27, 2012.

COPYRIGHT NOTICE

© 2013 Applied Physics Technologies. A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever. 37 CFR §1.71(d).

TECHNICAL FIELD

This disclosure relates to sources of field-enhanced thermionic emission and, in particular, to an electron source that is made from transition metal carbide material.

BACKGROUND INFORMATION

A commercially available standard Schottky electron source, Zr/O/W(100), uses the natural tendency of the tungsten (W) substrate material to re-form during processing to create a flat facet composed of the (100) crystallographic plane. During operation, a specific combination of temperature and electric field allows diffusion of zirconium (Zr) and oxygen (O) to create a low work function on the (100) facet plane at the apex of the emitter tip. This (100) facet or flat is responsible for the low work function in the presence of Zr and O and shapes the electric field at the apex. The work function of currently available commercial sources of Zr/O/W(100) electron emitters is dependent on temperature, electric field, and vacuum levels. Because of this dependence, Zr/O/W(100) electron sources are limited in the amount of current they can emit. Such limitation can be defined as total beam current, angular intensity, brightness, or reduced brightness. Currently available Zr/O/W(100) electron sources are typically limited to angular intensities of 0.2 to 1.0 mA/sr (milliamps/steradian).

SUMMARY OF THE DISCLOSURE

This application discloses a new type of electron source that is made from transition metal carbide materials, including hafnium carbide (HfC), zirconium carbide (ZrC), titanium carbide (TiC), vanadium carbide (VC), niobium carbide (NbC), and tantalum carbide (TaC). These mixed-metal carbide materials are of high refractory nature, and certain crystallographic planes of these materials exhibit relatively low work functions. Producing field-enhanced thermionic emission from these materials, i.e., thermal-field (T-F) or extended Schottky emission, entails the use of a certain low work function crystallographic direction, such as, for example, (100), (210), or (310). This material does not naturally facet because of its refractory nature. A rounded end-form or a flat truncation formed on this material would, however, persist because of its robust nature.

The disclosed electron source made from transition metal carbide material is especially useful when installed in a scanning electron microscope (SEM) performing advanced imaging applications that require a high brightness, high beam current source. Examples of such applications include neuroimaging and imaging electronic circuitry.

This application also discloses methods of making artificial truncations on single crystal tips, e.g., HfC(310), for use as T-F or Schottky type electron sources. Advantages of use of refractory carbide material include no reliance on diffusion of material for operation, e.g., Zr and O in the case of currently commercial sources, and an underlying substrate, e.g., HfC, that is not prone to geometrical change by temperature, electric fields, or residual background gas pressures, as is the case with tungsten substrates currently in commercial use in Schottky sources.

Additional aspects and advantages will be apparent from the following detailed description of preferred embodiments, which proceeds with reference to the accompanying drawings.

DETAILED DESCRIPTION OF PREFERRED EMBODIMENTS

Figure 1B:
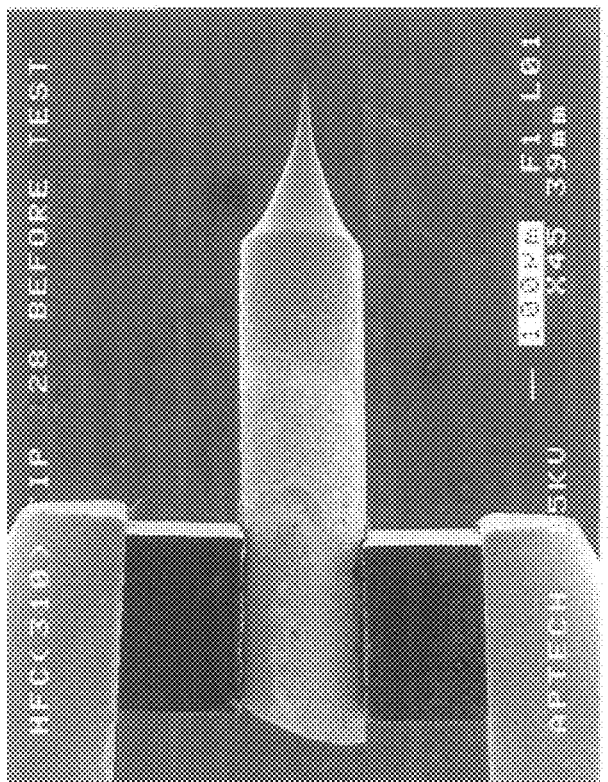
FIGS. 1A and 1B are SEM micrographs showing, respectively, perspective and side elevation views of two electrochemically etched HfC(310) rods of about 0.5 mm diameter held in a Vogel style mount.
Figure 1A:
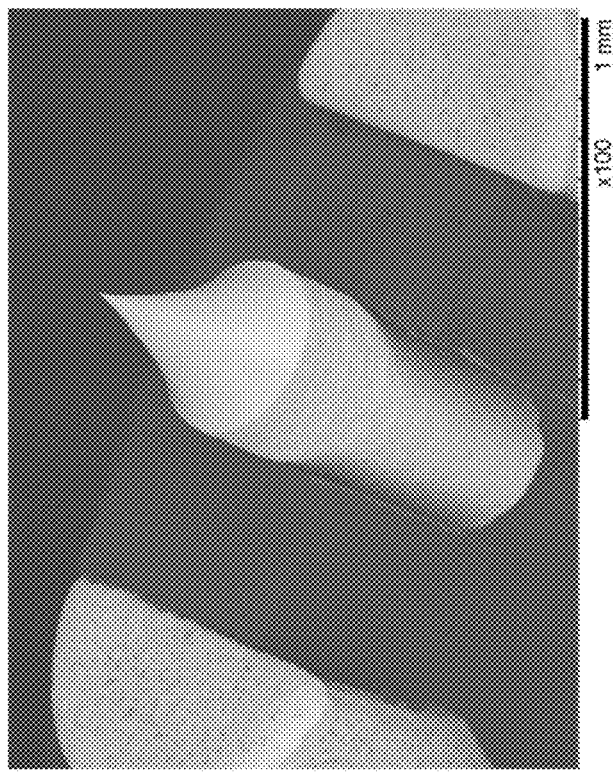
Figure 2:
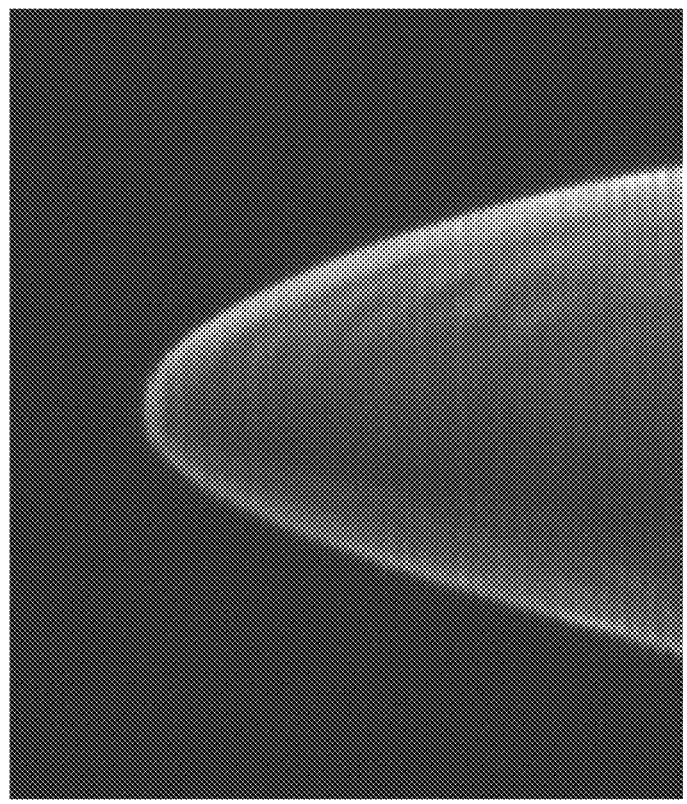
FIG. 2 is a magnified SEM micrograph showing the shape of the apex of about 100 nm radius of the electrochemically etched HfC(310) field emission electron source.

Single crystal rods are manufactured through a floating zone refining process. These rods are made from transition metal carbides, e.g., HfC, and are grown to a specific crystallographic orientation, e.g., (310) crystallographic direction on axis. These rods are then centerless ground and cut to length. The end of each rod is electrochemically etched to form a cuspate point, as shown in FIGS. 1A and 1B. The shank of this needle is mounted in a Vogel mount so that tip heating may be accomplished. The result is an emitter having a very sharp tip or rounded end-form tip with a small radius of curvature, as shown in FIG. 2.

Figure 3:
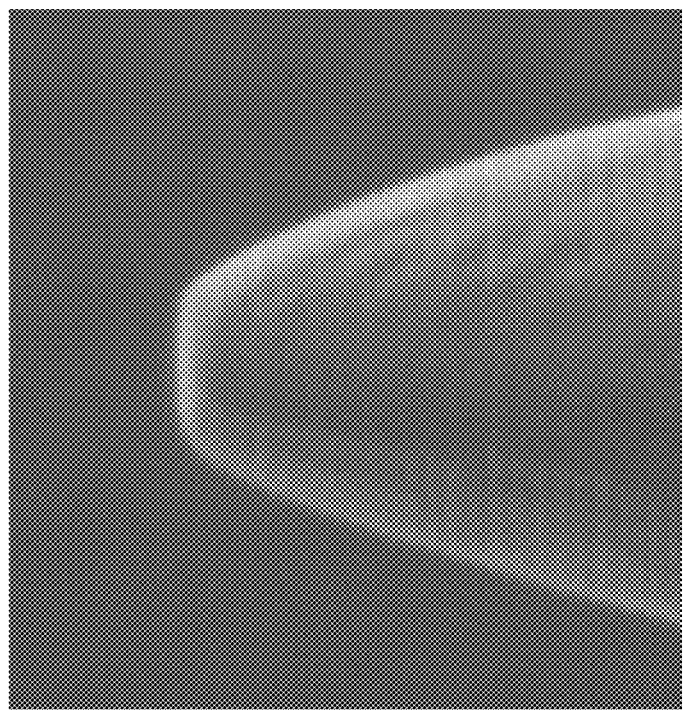
FIG. 3 shows the same tip as that shown in FIG. 2 but after the end of the tip has been cut off and focused ion beam (FIB) micromachining has been performed to form a tip having a flat or artificial truncation of about 220 nm in width.

Several methods including mechanical grinding, electrochemical etching, or other techniques can be used to form the flat end or facet for a T-F or Schottky configuration. One particular method shown by way of example here uses a commercially available focused ion beam system (FIB) to micromachine the cuspate point to form the truncation, which is shown in FIG. 3. This flat can be generated over a wide range of sizes or truncation diameters. (FIG. 3 shows as an example a 220 nm-wide facet.) The electrochemical tip etching process can be used to make tips with various cone angles and tip radii. Providing tips having specified cone angles and tip radii facilitates the ease with which use of the FIB method can make tips having different truncation diameters. The flat surface exposed by carrying out this process would be that of the crystallographic plane of the crystal rod. For example, if the original rod is HfC(310), then its exposed flat would have a (310) crystallographic plane, which would be the low work function surface.

Preferred truncation diameters of a flat end tip surface are between zero and about 1000 nm, preferred tip radii of curvature of a rounded end-form tip are between about 5 nm and about 500 nm, and preferred cone angles (half-angle) are between about 5° and about 45°.

Once the tip has been truncated, it may be necessary to treat the resulting faceted surface to eliminate residual ion milling material caused by the FIB process and to heal or remove any damaged substrate. This can be accomplished in a number of ways, including use of gas ion sputtering, electrochemical etching, or heating to very high temperatures. This last method can be accomplished, for example, by electron bombardment heating of the tip in vacuum to temperatures in excess of 2500 K for a short time (about 60 seconds).

Figures 4A, 4B:
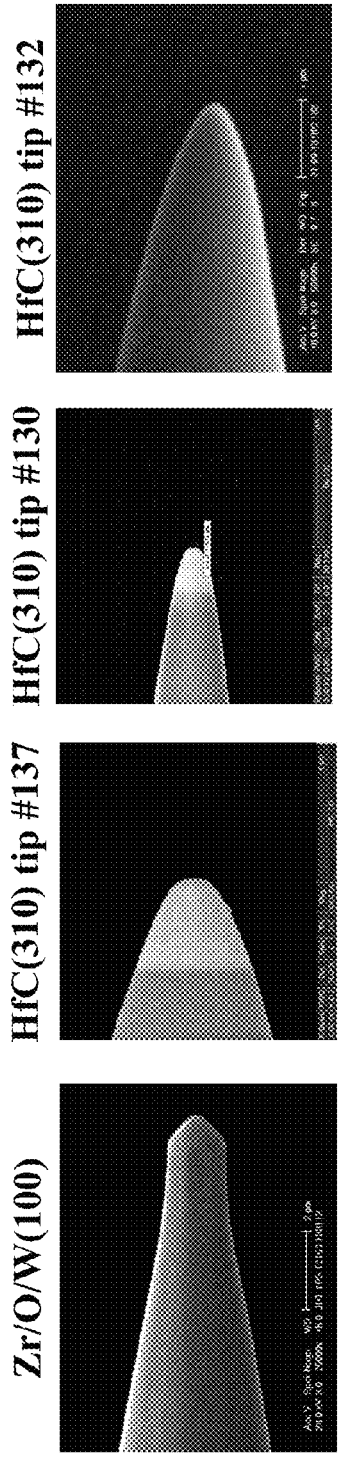
FIG. 4A is a table showing measured electron beam spot sizes for four electron beam emitter tips.
FIG. 4B shows scanning electron micrographs of the electron emitter beam tips identified in the table of FIG. 4A.

FIG. 4A presents a table specifying measured electron beam spot sizes for three HfC(310) emitter tips and a conventional Zr/O/W(100) emitter tip, and FIG. 4B shows scanning electron micrographs of the electron beam emitter tips specified in FIG. 4A. FIGS. 4A and 4B show that the HfC(310) electron emitter (tip #132) of rounded end-form produces an electron beam spot size that is 0.375 times that of the Zr/O/W(100) electron emitter.

Figure 5A:
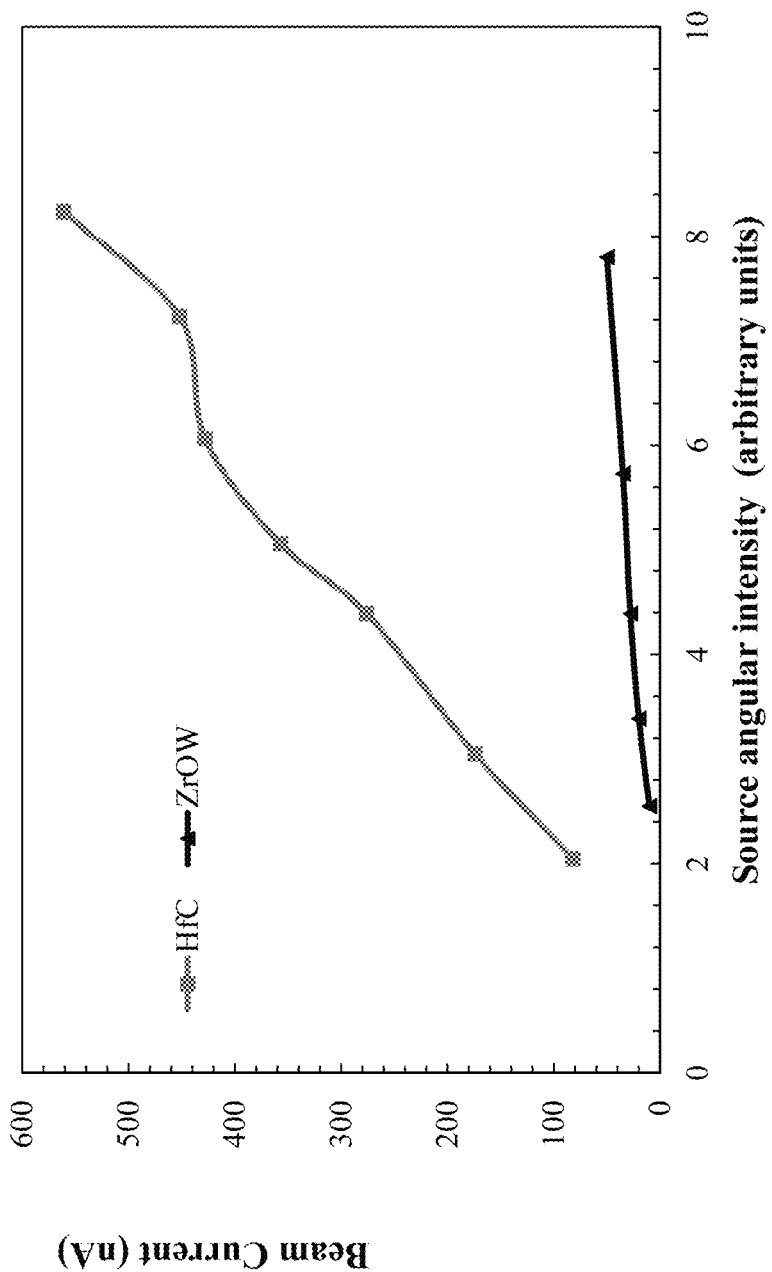
FIGS. 5A and 5B are graphs showing a comparative relationship between electron beam current produced by extended Schottky emission from a conventional Schottky electron source and the disclosed transition metal carbide electron source operating in, respectively, large and small aperture scanning electron microscopes.
Figure 5B:
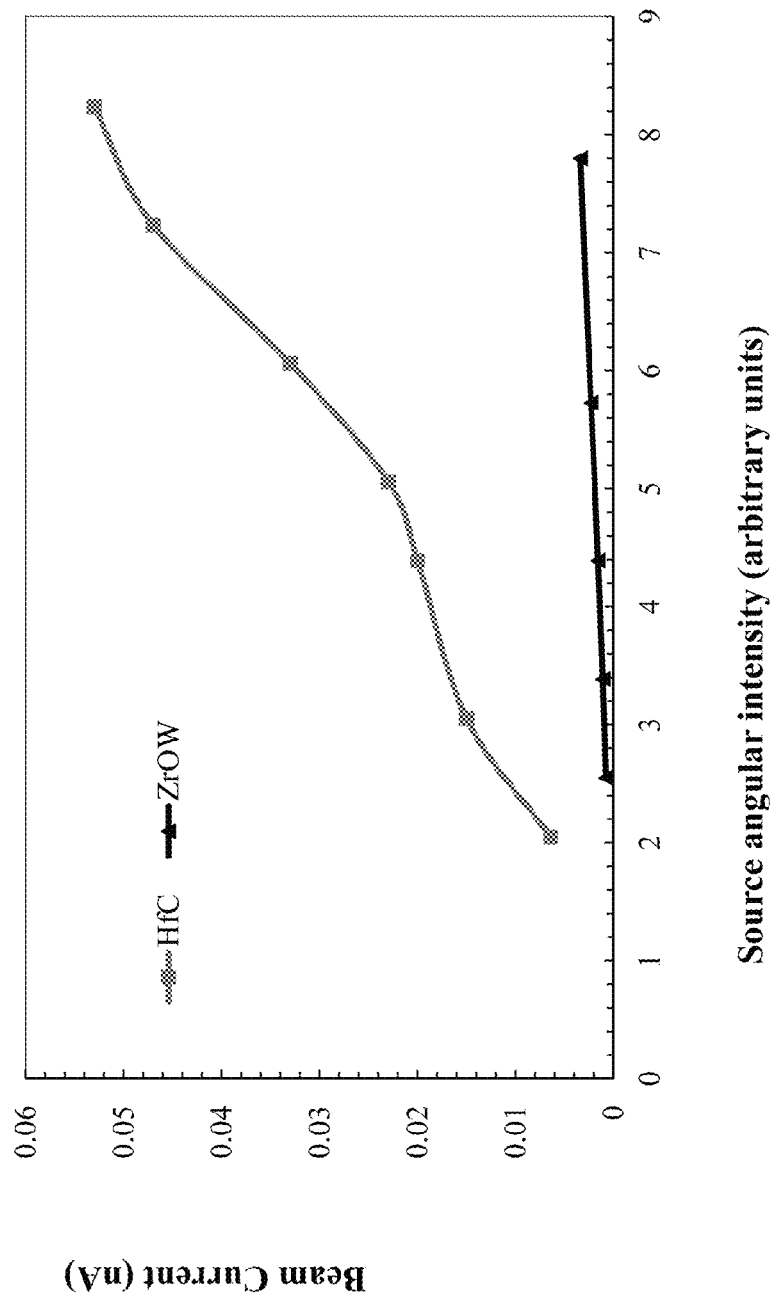

FIGS. 5A and 5B are graphs showing a comparative relationship between electron beam current produced by extended Schottky emission from a conventional Zr/O/W(100) Schottky electron source and a transition metal carbide (HfC(310)) electron source operating in, respectively, large (1200 µm) aperture and small (60 µm) aperture Philips XL40 SEMs. The Schottky source is the 300 nm-faceted Zr/O/W(100) emitter specified and shown in FIGS. 4A and 4B. This particular emitter is a commercially available component. The HfC(310) source is the 150 nm-radius rounded end-form emitter specified and shown in FIGS. 4A and 4B. The disclosed HfC(310) sources operating in a similar electron emission mode are capable of very high electron beam currents, angular intensity, and brightness. FIGS. 5A and 5B show that the HfC(310) electron source exhibits a minimum of about 10 times higher electron beam current than that of the conventional Zr/O/W(100) electron emitter. Applicants have recorded angular intensity levels from about 0.01 mA/sr to about 75 mA/sr and calculated values of brightness of between about 10 and 100 times higher than that of the conventional Zr/O/W(100) electron emitter.

Applicants have operated the disclosed HfC(310) electron emitter in a Philips XL40 SEM (with very slight modifications) to perform a straight up comparison of Zr/O/W(100) and HfC(310) electron emitters operating in the same emission mode and with the same parameter settings. The results for the HfC(310) electron emitter are 10 to 70 or more times greater measured electron beam current and 50% or greater reduction in measured spot size diameter of those of the Zr/O/W(100) electron emitter. Applicants have also operated the HfC(310) emitters in vacuum levels of greater than 20 times the vacuum levels at which the Zr/O/W(100) electron emitter typically operates.

Figure 6:
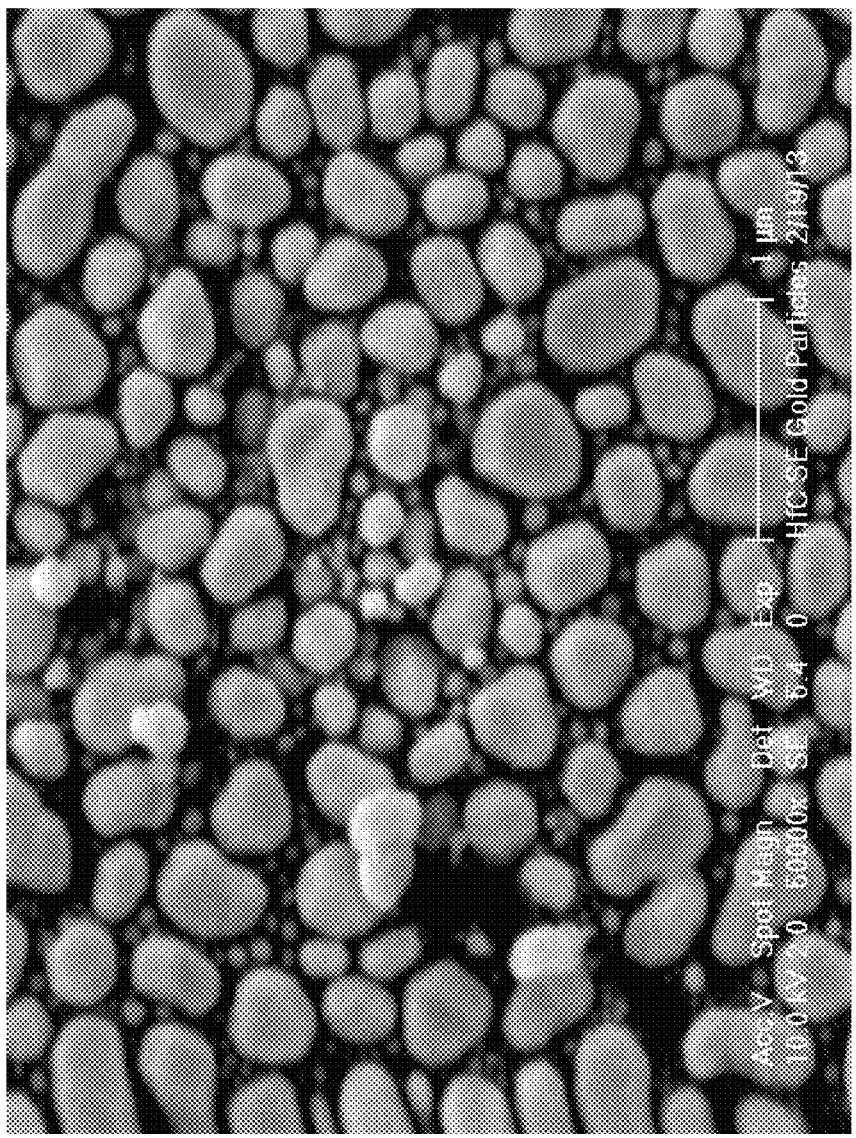
FIG. 6 is a scanning electron micrograph of a standard gold particle test target imaged by an SEM equipped with the disclosed HfC(310) electron emission source.

FIG. 6 shows an electron scanning micrograph of a standard gold particle test target imaged by an SEM equipped with the disclosed HfC(310) electron source operating at 10 KV beam voltage and having the tip #132 specified and shown in FIGS. 4A and 4B. The micrograph shows with high acuity and in great detail gold particles imaged at 50,000× magnification. The dimension line represents a 1 µm scale.

It will be obvious to those having skill in the art that many changes may be made to the details of the above-described embodiments without departing from the underlying principles thereof. The scope of the invention should, therefore, be determined only by the following claims.

The invention claimed is:

1. A source of thermal-enhanced field emission, comprising:
a substrate in the form of a unitary article made of a transition metal carbide material of high refractory nature, the substrate having a tip of rounded end-form in a low work function crystallographic direction for on-axis, high brightness electron emission and characterized by geometrical invariance in response to one or both of temperature and field change, the tip of rounded end-form having a radius of curvature of between about 5 nm and about 500 nm.

2. The source of claim 1, in which transition metal carbide material is selected from a group consisting essentially of HfC, ZrC, TiC, VC, NbC, and TaC.

3. The source of claim 1, in which the tip has a cone half-angle of between about 5° and about 45°.

4. The source of claim 1, in which the form of a unitary article is a single crystal rod.

5. The source of claim 1, in which the low work function crystallographic direction for on-axis, high brightness electron emission is one of (210) or (310).

6. The source of claim 1, in which the tip of rounded end-form includes an artificial facet of circular end-form.

7. A source of thermal-enhanced field emission, comprising:
a transition metal carbide substrate of high refractory nature, the substrate having a tip of rounded end-form in a low work function crystallographic direction for on-axis, high brightness electron emission; characterized by geometrical invariance in response to one or both of temperature and field change; and, during operation, in response to application of a beam voltage, producing electron emission at angular intensity levels of greater than 10 mA/sr and to about 75 mA/sr.

8. The source of claim 7, in which the transition metal carbide substrate is made of material selected from a group consisting essentially of HfC, ZrC, TiC, VC, NbC, and TaC.

9. The source of claim 7, in which the substrate is in the form of a single crystal rod.

10. The source of claim 7, in which the low work function crystallographic direction for on-axis, high brightness emission is one of (210) or (310).

11. The source of claim 7, in which the tip of rounded end-form includes an artificial facet of circular end-form.

12. The source of claim 7, in which the tip has a cone half-angle of between about 5° and about 45°.

* * * * *